US009870970B2

(12) United States Patent
Ko et al.

(10) Patent No.: US 9,870,970 B2
(45) Date of Patent: Jan. 16, 2018

(54) CURED PRODUCT

(71) Applicant: LG CHEM, LTD., Seoul (KR)

(72) Inventors: Min Jin Ko, Daejeon (KR); Kyung Mi Kim, Daejeon (KR); Jae Ho Jung, Daejeon (KR); Bum Gyu Choi, Daejeon (KR); Min Kyoun Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/035,903

(22) PCT Filed: Jan. 28, 2015

(86) PCT No.: PCT/KR2015/000930
§ 371 (c)(1),
(2) Date: May 11, 2016

(87) PCT Pub. No.: WO2015/115811
PCT Pub. Date: Aug. 6, 2015

(65) Prior Publication Data
US 2016/0257788 A1   Sep. 8, 2016

(30) Foreign Application Priority Data

| Jan. 28, 2014 | (KR) | 10-2014-0010012 |
| Jan. 28, 2014 | (KR) | 10-2014-0010013 |
| Jan. 28, 2014 | (KR) | 10-2014-0010014 |
| Jan. 28, 2014 | (KR) | 10-2014-0010015 |
| Jan. 28, 2015 | (KR) | 10-2015-0013478 |

(51) Int. Cl.
| C08G 77/12 | (2006.01) |
| H01L 23/29 | (2006.01) |
| C08G 77/20 | (2006.01) |
| C09J 183/04 | (2006.01) |
| C08G 77/00 | (2006.01) |
| C08G 77/08 | (2006.01) |
| H01L 33/56 | (2010.01) |
| C08G 77/38 | (2006.01) |
| C08L 83/04 | (2006.01) |
| C08K 5/5435 | (2006.01) |
| C08L 83/06 | (2006.01) |
| C08K 5/5419 | (2006.01) |
| C08G 77/14 | (2006.01) |

(52) U.S. Cl.
CPC ............ H01L 23/296 (2013.01); C08G 77/08 (2013.01); C08G 77/12 (2013.01); C08G 77/20 (2013.01); C08G 77/38 (2013.01); C08G 77/80 (2013.01); C08K 5/5419 (2013.01); C08K 5/5435 (2013.01); C08L 83/04 (2013.01); C08L 83/06 (2013.01); C09J 183/04 (2013.01); H01L 33/56 (2013.01); C08G 77/14 (2013.01); C08G 2170/00 (2013.01); C08G 2190/00 (2013.01); C08K 2201/008 (2013.01); C08L 2201/08 (2013.01); C08L 2201/10 (2013.01); C08L 2203/206 (2013.01); C08L 2205/025 (2013.01); C09J 2203/318 (2013.01); H01L 2933/005 (2013.01); H01L 2933/0033 (2013.01)

(58) Field of Classification Search
None
See application file for complete search history.

(56) References Cited

U.S. PATENT DOCUMENTS

| 8,969,478 | B2* | 3/2015 | Ko | C08K 5/54 257/100 |
| 9,177,883 | B2 | 11/2015 | Ko et al. | |
| 2011/0227235 | A1 | 9/2011 | Yoshitake et al. | |
| 2013/0008507 | A1* | 1/2013 | Ko | H01L 31/0481 136/259 |
| 2013/0009200 | A1 | 1/2013 | Ko et al. | |
| 2013/0009201 | A1* | 1/2013 | Ko | C08L 83/04 257/100 |
| 2014/0103390 | A1 | 4/2014 | Ko et al. | |
| 2014/0350195 | A1* | 11/2014 | Ko | H01L 23/296 525/478 |
| 2015/0137171 | A1* | 5/2015 | Ko | C08L 83/06 257/100 |
| 2015/0141607 | A1* | 5/2015 | Ko | G02F 1/133603 528/31 |
| 2015/0141608 | A1* | 5/2015 | Ko | C08G 77/04 528/32 |

FOREIGN PATENT DOCUMENTS

| EP | 2 784 129 B1 | 4/2017 |
| JP | H06-009929 A | 1/1994 |

(Continued)

OTHER PUBLICATIONS

Search Report issued for International Application No. PTC/KR2015/000930 dated Apr. 22, 2015 (3 pages).
Office Action issued for Taiwan Patent Application No. 104102897 dated Feb. 18, 2016 along with English translation (15 pages).
Office Action issued for Japanese Patent Application No. 2016-527209 dated Jul. 24, 2017, 4 pages.
Extended European Search Report issued for European Patent Application No. 15742608.1 dated Aug. 28, 2017, 7 pages.

*Primary Examiner* — Robert S Loewe
(74) *Attorney, Agent, or Firm* — Rothwell, Figg, Ernst & Manbeck, P.C.

(57) ABSTRACT

The present application relates to a cured product and the use thereof. When the cured product, for example, is applied to a semiconductor device such as an LED or the like, the decrease in brightness may be minimized even upon the long-term use of the device, and since the cured product has excellent cracking resistance, the device having high long-term reliability may be provided. The cured product has excellent processability, workability, and adhesive properties or the like, and does not cause whitening and surface stickiness, etc. Further, the cured product exhibits excellent heat resistance at high temperature, gas barrier properties, etc. The cured product may be, for example, applied as an encapsulant or an adhesive material of a semiconductor device.

14 Claims, No Drawings

(56) References Cited

FOREIGN PATENT DOCUMENTS

| | | | |
|---|---|---|---|
| JP | H11-274571 A | 10/1999 |
| JP | 2001-196151 A | 7/2001 |
| JP | 2002-226551 A | 8/2002 |
| JP | 2005-105217 A | 4/2005 |
| JP | 2010-1335 A | 1/2010 |
| JP | 2012-52045 A | 3/2012 |
| JP | 2012-140622 A | 7/2012 |
| JP | 2013-139547 A | 7/2013 |
| JP | 2013-147633 A | 8/2013 |
| KR | 10-2010-0031076 A | 3/2010 |
| KR | 10-2011-0053470 A | 5/2011 |
| KR | 10-2011-0087244 A | 8/2011 |
| KR | 10-2013-0058645 A | 6/2013 |
| TW | 201248938 A1 | 12/2012 |
| TW | 201335282 A1 | 9/2013 |
| WO | 2013/77707 A1 | 5/2013 |
| WO | 2013/077708 A1 | 5/2013 |

* cited by examiner

CURED PRODUCT

CROSS-REFERENCE TO RELATED APPLICATIONS

This application is a 35 U.S.C. §371 National Phase Entry Application from PCT/KR2015/000930, filed on Jan. 28, 2015, and designating the United States, which claims priority under 35 U.S.C. §119 to Korean Patent Application No. 10-2014-0010012, filed on Jan. 28, 2014, Korean Patent Application No. 10-2014-0010013, filed on Jan. 28, 2014, Korean Patent Application No. 10-2014-0010014, filed on Jan. 28, 2014, Korean Patent Application No. 10-2014-0010015, filed on Jan. 28, 2014, and Korean Patent Application No. 10-2015-0013478, filed on Jan. 28, 2015, the entire contents of which are incorporated herein by reference.

1. FIELD OF THE INVENTION

The present application relates to a cured product and the use thereof.

2. DISCUSSION OF RELATED ART

Light emitting diodes (LEDs) are devices used in various applications such as a light source of a display device, a lighting device, etc.

As an encapsulant of the LED, an epoxy resin having high adhesive properties and excellent dynamic durability is widely used. However, the epoxy resin has problems in that it has low transmittance with respect to light ranging from blue to ultraviolet regions and also shows poor heat resistance and light resistance. Accordingly, techniques have been proposed to solve the above-described problems, for example, such as in Patent documents 1 to 3, etc. However, the encapsulants which have been known up to now have insufficient gas barrier properties, adhesive properties, or the like, and poor heat resistance, heat and shock durability, and cracking resistance.

PRIOR ART DOCUMENTS

Patent Documents

Patent document 1: Japanese Patent Laid-open Publication No. 1999-274571
Patent document 2: Japanese Patent Laid-open Publication No. 2001-196151
Patent document 3: Japanese Patent Laid-open Publication No. 2002-226551

DETAILED DESCRIPTION OF THE INVENTION

Technical Object

The present application is directed to providing a cured product and the use thereof.

Technical Solution

According to an aspect of the present application, the cured product may be a reaction product of a mixture including an aliphatic unsaturated bond functional polyorganosiloxane and a compound (cross linking agent) having hydrogen atoms bound to silicon atoms, and for example, may be a hydrosilylation reaction product of the mixture.

The above-described cured product may include, for example, one or more siloxane units selected from the group consisting of a so-called monofunctional siloxane unit (hereinafter, referred to as an M unit) which may be usually represented by ($R_3SiO_{1/2}$), a so-called difunctional siloxane unit (hereinafter, referred to as a D unit) which may be usually represented by ($R_2SiO_{2/2}$), a so-called trifunctional siloxane unit (hereinafter, referred to as a T unit) which may be usually represented by ($RSiO_{3/2}$), and a so-called quadfunctional siloxane unit (hereinafter, referred to as a Q unit) which may be usually represented by ($SiO_{4/2}$). In the formula of each siloxane unit, R is a functional group bound to silicon (Si), and for example, may be hydrogen, an alkoxy group, an epoxy group, or a monovalent hydrocarbon group.

The cured product may include one or more units represented by the following Formula 1.

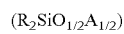

$(R_2SiO_{1/2}A_{1/2})$  [Formula 1]

In Formula 1, each R is independently hydrogen, an epoxy group, an alkoxy group, or a monovalent hydrocarbon group, and A is an alkylene group having 1 to 4 carbon atoms.

The term "epoxy group" used in the present specification, unless otherwise defined, may denote a cyclic ether having three ring-forming atoms or a monovalent residue derived from a compound including the cyclic ether. Examples of the epoxy group may include a glycidyl group, an epoxy alkyl group, a glycidoxyalkyl group, or alicyclic epoxy group, etc. In the above description, the alicyclic epoxy group may include the alicyclic epoxy group may denote a monovalent residue derived from a compound including an aliphatic hydrocarbon ring structure and a structure in which two carbon atoms forming the aliphatic hydrocarbon ring also form the epoxy group. An example of the alicyclic epoxy group may be an alicyclic epoxy group having 6 to 12 carbon atoms, and for example, may be a 3,4-epoxy cyclohexylethyl group, etc.

The term "monovalent hydrocarbon group" used in the present specification, unless otherwise defined, may denote a monovalent residue derived from a compound including carbon and hydrogen or a derivative of the compound. For example, the monovalent hydrocarbon group may include 1 to 25 carbon atoms. Examples of the monovalent hydrocarbon group may include an alkyl group, an alkenyl group, or an alkynyl group, etc.

The term "alkyl group or alkoxy group" used in the present specification, unless otherwise defined, may denote an alkyl group or alkoxy group having 1 to 20 carbon atoms, 1 to 16 carbon atoms, 1 to 12 carbon atoms, 1 to 8 carbon atoms, or 1 to 4 carbon atoms. The alkyl group or alkoxy group may have a straight chain, branched chain, or ring shape. Further, the alkyl group or alkoxy group may be arbitrarily substituted with one or more substituents.

The term "alkenyl group" used in the present specification, unless otherwise defined, may denote an alkenyl group having 2 to 20 carbon atoms, 2 to 16 carbon atoms, 2 to 12 carbon atoms, 2 to 8 carbon atoms, or 2 to 4 carbon atoms. The alkenyl group may have a straight chain, branched chain, or ring shape, and may be arbitrarily substituted with one or more substituents.

The term "alkynyl group" used in the present specification, unless otherwise defined, may denote an alkynyl group having 2 to 20 carbon atoms, 2 to 16 carbon atoms, 2 to 12 carbon atoms, 2 to 8 carbon atoms, or 2 to 4 carbon atoms.

The alkynyl group may have a straight chain, branched chain, or ring shape, and may be arbitrarily substituted with one or more substituents.

The term "aryl group" used in the present specification, unless otherwise defined, may denote a monovalent residue derived from a compound which is connected to a benzene ring or two or more benzene rings, or which includes a structure sharing one or two or more carbon atoms and condensed or bound, or a derivative of the compound. The aryl group used in the present specification may include a so-called aralkyl group or arylalkyl group or the like as well as a functional group which is a so-called aryl group. The aryl group, for example, may be an aryl group having 6 to 25 carbon atoms, 6 to 21 carbon atoms, 6 to 18 carbon atoms, or 6 to 12 carbon atoms. Examples of the aryl group may include a phenyl group, a dichlorophenyl group, a chlorophenyl group, a phenylethyl group, a phenylpropyl group, a benzyl group, a tolyl group, a xylyl group, a naphthyl group, etc.

In the present specification, examples of the substituent which may be arbitrarily substituted with an epoxy group, an alkoxy group, or a monovalent hydrocarbon group, may include a halogen atom such as chlorine, fluorine or the like, an epoxy group such as a glycidyl group, an epoxy alkyl group, a glycidoxyalkyl group, an alicyclic epoxy group or the like, an acryloyl group, methacryloyl group, an isocyanate group, a thiol group, a monovalent hydrocarbon group or the like, but are not limited thereto.

The unit of Formula 1 may be formed by a reaction between the aliphatic unsaturated bond and the hydrogen atoms bound to the silicon atoms in a formation process of the cured product, and accordingly, the ratio (C/Si) may be adjusted by selecting a type, a ratio and/or reaction condition of a material of the cured product. When the ratio (C/Si) is adjusted in the above-described range, the cured product being suitable for the desired purpose may be formed, and particularly, the cured product having excellent heat resistance, cracking resistance, and heat and shock durability may be provided. In the formation process of the cured product, a specific method of adjusting the ratio (C/Si) will be described below.

In another embodiment, A may be an alkylene group having 1 to 3 carbon atoms, 1 to 2 carbon atoms, or 2 carbon atoms in Formula 1.

The unit of Formula 1 is a unit having a structure in which at least two silicon atoms (Si) included in the cured product are connected by an alkylene group represented by A.

In the cured product, a ratio (C/Si) of the number of moles of carbon atoms (C) which are present in A of Formula 1 to the total number of moles of silicon atoms (Si) may be in the range of 0.15 to 0.55. In another embodiment, the ratio (C/Si) may be 0.2 or more. Further, in still another embodiment, the ratio (C/Si) may be, for example, 0.5 or less, 0.45 or less, or 0.4 or less.

The ratio may be obtained by performing an NMR analysis, for example, a $^{29}$Si-NMR analysis with respect to the cured product. The NMR analysis is performed through nuclear magnetic resonance and a phenomenon in which a substance including atomic nuclei ($^{29}$Si) having magnetic moment absorbs electromagnetic waves at a specific frequency. The absorption varies according to a type of the atomic nuclei, and even when the atomic nuclei are the same, the absorption varies according to chemical environments surrounding the atoms (e.g., a type of atom bound to the atoms). Accordingly, the ratio may be measured through a specific absorption spectrum represented according to the type of the atomic nucleus or the chemical environments thereof. The cured product is usually a solid at room temperature, and thus a high temperature NMR method or a solid phase NMR method may be applied thereto.

The cured product may include an aryl group, for example, the aryl group bound to the silicon atoms. The aryl group may be included, for example, such that a ratio (Ar/Si) of the number of moles of the aryl group (Ar) to the total number of moles of silicon atoms (Si) is in a range of 0.2 to 1.2 or 0.4 to 1.0. When the aryl group is included in the above-described range, for example, excellent light extraction efficiency may be ensured when the cured product is applied to an optical semiconductor device such as an LED or the like, and the cured product of which gas permeable properties are effectively adjusted may be provided. The ratio (Ar/Si) may be adjusted by control of the number of moles of the aryl group and silicon atoms being present in the polyorganosiloxane or the crosslinking agent forming the cured product. The ratio may be measured using the above-described NMR method.

As described above, the cured product may include one or more siloxane units selected from the group consisting of an M, D, T and Q unit, and in the embodiment, the cured product may include at least one of the T units, for example, the unit represented by the following Formula 2.

$$(RSiO_{3/2})$$ [Formula 2]

In Formula 2, R is hydrogen, an epoxy group, an alkoxy group, or a monovalent hydrocarbon group.

The unit of Formula 2, for example, may be included such that a ratio (T/Si) of the number of moles of the T unit (T) to the total number of moles of silicon atoms (Si) is in the range of about 0.3 to about 0.6 or about 0.35 to 0.5. When the T unit is included in the above-described range, for example, the cured product having excellent properties required for the desired purpose such as mechanical strength, gas permeable properties, or the like may be provided. The ratio (T/Si) may be adjusted by control of a ratio between the T units and the silicon atoms included in the polyorganosiloxane, the cross linking agent, etc. The ratio may also be measured using the above-described NMR method.

The cured product may include one or more T units including the silicon atoms bound to the aryl group. For example, the T unit including the silicon atoms bound to the aryl group may be included such that the ratio (T/Si) of the number of moles of the T unit (T) to the total number of moles of silicon atoms (Si) is in the range of about 0.19 to about 0.6, or about 0.3 to about 0.6. When the T unit is included in the above-described range, for example, excellent light extraction efficiency may be ensured when the cured product is applied to an optical semiconductor device such as an LED or the like, and the cured product of which gas permeable properties are effectively adjusted may be provided. The ratio (T/Si) may be adjusted by control of a ratio between the T units and the silicon atoms included in the polyorganosiloxane, the cross linking agent, etc. The ratio may also be measured using the above-described NMR method.

The cured product may include one or more D units in the above-described siloxane units. For example, the D unit may be included such that a ratio (D/Si) of the number of moles of the D unit (D) to the total number of moles of silicon atoms (Si) is in the range of about 0.6 or less, 0.55 or less, 0.5 or less, 0.45 or less or 0.4 or less. In another embodiment, the ratio (D/Si) may be more than 0, 0.01 or more, 0.05 or more, 0.1 or more, or 0.15 or more. When the D unit is included in the above-described range, for example, physical properties such as cracking resistance, heat resistance, and heat and shock durability or the like may be improved. The ratio (D/Si) may be adjusted by control of a ratio between the D units and the silicon atoms included in the polyorganosiloxane, the cross linking agent, etc. The ratio may also be measured using the above-described NMR method.

The cured product may include an epoxy group, for example, one or more epoxy groups bound to the silicon atoms. The epoxy group, for example, may be included such that a ratio (E/Si) of the number of moles of the epoxy group (E) to the total number of moles of silicon atoms (Si) is in the range of 0.0001 to 0.15. In another embodiment, the ratio (E/Si) may be 0.001 or more. In still another embodiment, the ratio (E/Si) may be, for example, about 0.1 or less, or about 0.05 or less. When the epoxy group is included in the above-described range, the cured product having excellent adhesive properties to be applied for the various purposes may be provided. The ratio (E/Si) may be adjusted by control of a ratio between the epoxy groups and the silicon atoms included in the polyorganosiloxane and the cross linking agent.

The cured product may include one or more alkenyl groups bound to the silicon atoms. Usually, the cured product formed by a reaction between the aliphatic unsaturated bond such as the alkenyl group and the hydrogen atoms bound to the silicon atoms is formed such that all the aliphatic unsaturated bond which is a reactive functional group and the hydrogen atoms bound to the silicon atoms are exhausted, but a certain amount of the alkenyl group may be present in the cured product. The alkenyl group, for example, may be included such that a ratio (Ak/Si) of the number of moles of the alkenyl group (Ak) to the total number of moles of silicon atoms (Si) is more than 0, or 0.001 or more, about 0.15 or less, or about 0.1 or less. This may improve physical properties such as cracking resistance, heat resistance, and heat and shock durability, etc. The ratio (Ak/Si) may be obtained by adjusting a ratio of the alkenyl group which is the aliphatic unsaturated bond to be higher than that of the hydrogen atoms bound to the silicon atoms which react therewith in the mixture forming the cured product, or by adjusting the curing conditions so as to remain the alkenyl group. The ratio may also be measured using the above-described NMR method.

The alkenyl group, for example, may be included in the M unit. For example, the cured product may include the unit of the following Formula 3 as the M unit.

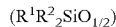  [Formula 3]

In Formula 3, $R^1$ is an alkenyl group, and $R^2$ is a monovalent hydrocarbon group, and for example, may be an alkyl group.

The unit of Formula 3 is the M unit including at least one alkenyl group, and this unit, for example, may be included such that a ratio (V/Si) of the number of moles of the M unit (V) to the total number of moles of silicon atoms (Si) in the cured product is more than 0, 0.001 or more, about 0.15 or less, or about 0.1 or less. Accordingly, the cured product having suitable physical properties may be obtained.

The cured product may be obtained by reacting the mixture including the aliphatic unsaturated bond functional polyorganosiloxane and the compound (cross linking agent) having the hydrogen atoms bound to the silicon atoms, for example, by a hydrosilylation reaction thereof. In the above-described process, the alkylene group may be generated by a reaction between the aliphatic unsaturated bond and the hydrogen atoms, thus generating the unit of Formula 1, and the aliphatic unsaturated bonds or the hydrogen atoms may be left in the process.

Accordingly, the unit of Formula 1 and the ratios (e.g., C/Si, Ak/Si, etc.) may be basically adjusted by adjusting the ratio between the aliphatic unsaturated bond included in the polyorganosiloxane to the hydrogen atoms being present in the crosslinking agent, and the ratio between the catalysts promoting the reaction thereof.

However, in the present application, it was determined that the adjustment of the ratio is difficult by simply adjusting the ratio between the aliphatic unsaturated bond included in the polyorganosiloxane to the hydrogen atoms being present in the crosslinking agent, and the reaction environment is required to be considered as well. For example, the optical semiconductor such as an LED or the like in which the cured product is mainly used may have various materials for housing such as a polyphthalamide (PPA), polycyclohexylene-dimethylene terephthalates (PCT), an epoxy molding compound (EMC), a white silicone, or the like, and one of the above-described housing materials may be selected to be used according to the purpose. The curing process to form the cured product is usually performed in a state in which the curable composition, that is, the mixture including the polyorganosiloxane and the crosslinking agent is injected into the housing material. In the above-described curing process, outgassing is largely generated according to the housing materials, the reaction between the aliphatic unsaturated bond and the hydrogen atoms decreases, and thus the desired ratio (C/Si) may not be obtained.

Accordingly, it may be advantageous to select the housing material causing less outgassing, or to perform an injection of the curable composition and the curing process after performing a prebaking process for the housing material causing outgassing to obtain the ratio (C/Si).

In addition to the above description, the factors related to curing of the curable composition are various, and the curing reaction is required to be performed to obtain the ratio (C/Si, etc.) in consideration of the factors.

In the above description, as the aliphatic unsaturated bond functional polyorganosiloxane, for example, a polyorganosiloxane having the average unit of the following Formula 4 may be used

  [Formula 4]

In Formula 4, P is an alkenyl group, Q is an epoxy group, an alkoxy group, or a monovalent hydrocarbon group, a and b are numbers such that a+b is in the range of 1 to 2.2, and a/(a+b) is in the range of 0.001 to 0.15.

In another embodiment, a+b may be 1.1 or more, 1.2 or more, 1.3 or more, or 1.4 or more in Formula 4. Further, in still another embodiment, a+b may be 2.1 or less, 2.0 or less, or 1.9 or less in Formula 4.

In still another embodiment, a/(a+b) may be 0.005 or more, 0.01 or more, 0.03 or more, or 0.06 or more in Formula 4. Further, in still another embodiment, a/(a+b) may be 0.4 or less, 0.3 or less, 0.25 or less, 0.2 or less, or 0.15 or less in Formula 4.

In the present specification, "polyorganosiloxane has a specific average unit" may include the case in which the polyorganosiloxane is a mixture of two or more components and represented by the average unit of the composition of the mixture as well as the case in which the polyorganosiloxane is a single component having the average unit.

In the embodiment, the polyorganosiloxane having the average unit of Formula 4 may include at least one of a linear polyorganosiloxane, a partially crosslinked polyorganosiloxane or a crosslinked polyorganosiloxane.

In the present specification, the term "linear polyorganosiloxane" may denote a polyorganosiloxane including only M and D units as a siloxane unit, the term "partially crosslinked polyorganosiloxane" may denote a polyorganosiloxane including the T or Q unit together with the D unit, and having a structure of a sufficiently long linear structure derived from the D unit, in which a ratio of the D units to the total number of D, T and Q units (D/(D+T+Q)) is 0.7 or more and less than 1. In the present specification, the term "crosslinked polyorganosiloxane" may denote a polyorganosiloxane essentially including the T or Q unit, in which the ratio (D/(D+T+Q)) is 0 or more and less than 0.7.

In Formula 4, at least one Q may be an aryl group. For example, in Formula 4, the aryl group of Q may be present in the amount allowing a ratio (Ar/Si) of the number of moles of the aryl group (Ar) to the total number of moles of silicon atoms included in the polyorganosiloxane (Si) to be in the range of 0.3 to 1.0, or 0.5 to 1.0.

In Formula 4, at least one Q may be an epoxy group. For example, in Formula 4, the epoxy group of Q may be present in the amount allowing a ratio (E/Si) of the number of moles of the epoxy group (E) to the total number of moles of silicon atoms included in the polyorganosiloxane (Si) to about 0.2 or less, about 0.15 or less, about 0.1 or less, about 0.05 or less, or about 0.03 or less.

The polyorganosiloxane which is the average unit of Formula 4, for example, may have a weight-average molecular weight (Mw) in the range of about 1,000 to 10,000, about 1,500 to about 8,000, about 1,500 to 6,000, about 1,500 to 4,000, or about 1,500 to 3,000. In the present specification, the term "weight-average molecular weight" may denote a conversion value of standard polystyrene measured by gel permeation chromatograph (GPC). Unless otherwise defined, the term "molecular weight" may denote a weight-average molecular weight. When a molecular weight of the polyorganosiloxane which is the average unit of Formula 4 is adjusted in the above-described range, formability and workability before curing, or strength after curing may be effectively maintained.

The compound including hydrogen atoms bound to silicon atoms, which is included in the mixture, for example, may be a linear, a partially crosslinked, or a crosslinked polyorganosiloxane having at least one of the hydrogen atoms.

For example, the compound may have an average unit of the following Formula 5.

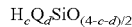   [Formula 5]

In Formula 5, Q is an epoxy group, an alkoxy group, or a monovalent hydrocarbon group, and c and d are numbers such that c+d is in the range of 1 to 2.8, and c/(c+d) is in the range of 0.001 to 0.34.

In another embodiment, in Formula 5, c+d may be in the range of 1.5 to 2.8, about 2 to 2.8, or about 2.3 to 2.8. Further, in Formula 5, c/(c+d) may be in the range of about 0.005 to 0.34, about 0.01 to 0.34, about 0.05 to 0.34, about 0.1 to 0.34 or about 0.15 to 0.34.

The above-described compound may be a curing agent capable of forming the cured product by reacting the aliphatic unsaturated bond of the above-described aliphatic unsaturated bond functional polyorganosiloxane, and crosslinking the mixture. For example, an addition reaction between the hydrogen atoms of the compound and the aliphatic unsaturated bond of the aliphatic unsaturated bond functional polyorganosiloxane may form the cured product.

In the average unit of Formula 5, at least one Q may be an aryl group. For example, the aryl group of Q may be present in the amount such that a ratio (Ar/Si) of the number of moles of the aryl group (Ar) to the total number of moles of silicon atoms (Si) included in the compound having the average unit of Formula 5 is, for example, in the range of 0.25 or more, 0.3 or more, 0.3 to 1.0, or 0.5 to 1.0.

The compound having the average unit of Formula 5 may be solid or liquid. When the compound is a liquid, a viscosity thereof at 25° C. may be in the range of 300 mPa·s or less, or 300 mPa·s or less. When the viscosity is controlled as described above, processability of the mixture, hardness properties of the cured product may be excellently maintained. The compound, for example, may have a molecular weight of less than 1,000, or less than 800. When the molecular weight is adjusted in the above-described range, strength of the cured product or the like may be maintained in a suitable range. The lower limit of the molecular weight of the compound is not particularly limited, and for example, may be 250.

As the compound having the average unit of Formula 5, various types of the compounds satisfying the properties as described above may be used. For example, a compound of the following Formula 6 may be used as the compound.

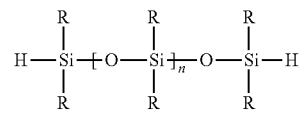   [Formula 6]

In Formula 6, each R is independently hydrogen, an epoxy group, or a monovalent hydrocarbon group, and n is a number in the range of 1 to 10. In Formula 6, R may be, for example, an aryl group or an alkyl group, and may be an alkyl group or an aryl group in the range satisfying a ratio (Ar/Si) of the aryl group of the compound having the average unit of the compound.

In Formula 6, n may be, for example, in the range of 1 to 8, 1 to 6, 1 to 4, 1 to 3 or 1 to 2.

A ratio, a viscosity, or a molecular weight of the aryl group of the compound of Formula 6 may be in the above-described range.

A content of the compound including the hydrogen atoms bound to the silicon atoms, for example, such as the compound having the average unit of Formula 5 or the compound of Formula 6 may be selected in the range in which the mixture has the above-described properties after curing. For example, the content of the compound may be selected in the range in which a ratio (H/Ak) of the number of moles of the hydrogen atoms of the compound (H) to the number of moles of the aliphatic unsaturated bond of the aliphatic unsaturated bond functional polyorganosiloxane (Ak) is in the range of 0.5 to 3.0, 0.7 to 2, or 1.05 to 1.3.

The mixture may further include a hydrosilylation catalyst. The hydrosilylation catalyst may be used to promote a hydrosilylation reaction. All typical components known in the related field may be used as the hydrosilylation catalyst. Examples of the catalyst may include platinum, palladium, a rhodium-based catalyst, etc. A platinum-based catalyst may be used in consideration of catalyst efficiency, and examples of the platinum-based catalyst may include chloroplatinic acid, platinum tetrachloride, olefin complexes of platinum, alkenylsiloxane complexes of platinum or carbonyl complexes of platinum or the like, but are not limited thereto.

A content of the hydrosilylation catalyst is not particularly limited as long as the hydrosilylation catalyst is included in a so-called catalyst amount, that is, in the amount acting as the catalyst. Usually, the content of 0.1 to 200 ppm, or 0.2 to 100 ppm based on an atomic weight of platinum, palladium, or rhodium may be used.

Further, the mixture may further include a tackifier in terms of an additional improvement of adhesive properties with respect to various base materials. The tackifier, as a component capable of improving self-adhesive properties, may particularly improve self-adhesive properties with respect to metals and organic resins.

Examples of the tackifier may include a silane having at least one type, or at least two types of functional groups selected from the group consisting of an alkenyl group such as a vinyl group, a (meth)acryloyloxy group, a hydrosilyl group (—SiH), an epoxy group, an alkoxy group, an alkoxy silyl group, a carbonyl group, and a phenyl group; or an organic silicon compound such as a cyclic or linear siloxane having 2 to 30, or 4 to 20 silicon atoms, but are not limited thereto. In the embodiment of the present application, one type or two or more types of the above-described tackifiers may be further mixed and used.

When the tackifier is included, for example, the tackifier may be included in the ratio of 0.1 to 20 parts by weight with respect to 100 parts by weight of solid fractions of the mixture, but the content may be suitably modified in consideration of a desired improvement effect of the adhesive properties, etc.

The mixture may further include one type or two or more types of additives including a reaction inhibitor such as 2-methyl-3-butyne-2-ol, 2-phenyl-3-1-butyne-2-ol, 3-methyl-3-pentene-1-yne, 3,5-dimethyl-3-hexene-1-yne, 1,3,5,7-tetramethyl-1,3,5,7-tetrahexenylcyclotetrasiloxane, ethynylcyclohexane, or the like; an inorganic filler such as silica, alumina, zirconia, titania, or the like; a carbonfunctional silane having an epoxy group and/or an alkoxysilyl group, a partial hydrolysis-condensation product thereof or a siloxane compound; a thixotropic agent such as a haze-phase silica or the like which can be used in combination with polyether; a filler; a phosphor; a conductivity providing agent such as metal powder of silver, copper, aluminum, or the like, or various carbon materials, or the like; or a color adjusting agent such as a pigment, dye, or the like, as needed.

The conditions of forming the cured product by curing the mixture are set such that the final cured product includes the above-described composition. For example, the cured product may be formed by maintaining the mixture at a temperature of about 60 to 200° C. for 10 minutes to 5 hours.

According to another aspect of the present application, there is provided a semiconductor device, for example, an optical semiconductor device. An illustrative semiconductor device may be encapsulated by an encapsulant including the cured product. Examples of a semiconductor device encapsulated by an encapsulant may include a diode, a transistor, a thyristor, a photocoupler, a charge-coupled device (CCD), a solid-phase image pick-up device, a monolithic integrated circuit (IC), a hybrid IC, a large-scale integration (LSI), a very-large-scale integration (VLSI), a light-emitting diode (LED), etc. In one embodiment, the semiconductor device may be an LED.

An example of the LED may include, for example, an LED formed by stacking a semiconductor material on a substrate. Examples of the semiconductor material may include, but are not limited to, GaAs, GaP, GaAlAs, GaAsP, AlGaInP, GaN, InN, AlN, InGaAlN, SiC, etc. Further, examples of the substrate may include sapphire, spinel, SiC, Si, ZnO, a GaN single crystalline, etc.

Upon manufacture of the LED, when necessary, a buffer layer may be formed between a substrate and a semiconductor material. As the buffer layer, GaN or AlN may be used. A method of stacking the semiconductor material on the substrate may be, but is not particularly limited to, an MOCVD method, a HDVPE method, a liquid growth method, etc. Further, a structure of the LED may be, for example, a monojunction including an MIS junction, a PN junction, and a PIN junction, a heterojunction, a double heterojunction, etc. Further, the LED may be formed using a mono or multiple quantum well structure.

In one embodiment, an emission wavelength of the LED may be, for example, 250 to 550 nm, 300 to 500 nm, or 330 to 470 nm. The emission wavelength may denote a main emission peak wavelength. When the emission wavelength of the LED is set in the above-described range, a white LED having a longer life time, high energy efficiency and high color expression may be obtained.

The LED may be encapsulated by the cured product, and accordingly, the encapsulation process of the LED may be performed using the above-described mixture. The encapsulation of the LED may be performed only using the mixture, and in some cases, another encapsulant may be used in combination with the mixture. When two types of encapsulants are used in combination, after the encapsulation using the mixture, the encapsulated LED may also be encapsulated with another encapsulant. Alternatively, the LED may be first encapsulated with the other encapsulant and then encapsulated again with the mixture. Examples of the other encapsulant may include an epoxy resin, a silicone resin, an acryl resin, a urea resin, an imide resin, glass, etc.

As a method of encapsulating the LED with the mixture, for example, a method including injecting the mixture into a mold in advance, dipping a lead frame to which the LED is fixed therein, and then curing the composition, etc. A method of injecting the mixture may include injection by a dispenser, transfer molding, injection molding, etc. Further, as other encapsulating methods, a method of coating the LED with the mixture by dropping, screen printing or a mask, and curing the mixture, a method of injecting the mixture into a cup in which the LED is disposed on its bottom by a dispenser, and curing the mixture, or the like may be included.

The mixture may be used as a die bond material for bonding the LED in a lead terminal or package, a passivation film on the LED, a package substrate, etc.

A shape of the encapsulant is not particularly limited, and for example, the encapsulant may be made in the form of a bullet-shaped lens, a plate or a thin film.

Further improvement of the performance of the LED may be achieved according to conventional known methods. Examples of a method of improving the performance may include, for example, a method of forming a reflective layer or light collecting layer on a back surface of the LED, a method of forming a complementary coloring portion on a bottom portion of the LED, a method of forming a layer for absorbing light having a shorter wavelength than the main emission peak on the LED, a method of encapsulating the LED and further molding the LED with a hard material, a method of fixedly inserting the LED into a through hole, a method of bonding the LED with a lead member by flip-chip bonding to extract light from a direction of the substrate, etc.

The optical semiconductor, for example, the LED may be effectively applied to, for example, backlights of a liquid crystal display device (LCD), lightings, various types of sensors, light sources of a printer and a copy machine, light sources for an automobile gauge, traffic lights, pilot lamps, display devices, light sources of planar-type LEDs, displays, ornaments or various lightings, etc.

Effect of the Invention

When the illustrative cured product, for example, is applied to a semiconductor device such as an LED or the like, the decrease in brightness may be minimized even upon the long-term use of the device, and since the cured product has excellent cracking resistance, the device having high long-term reliability may be provided. The cured product has excellent processability, workability, and adhesive properties or the like, and does not cause whitening and surface stickiness, etc. Further, the cured product exhibits excellent heat resistance at high temperature, gas barrier properties, etc. The cured product may be, for example, applied as an encapsulant or an adhesive material of a semiconductor device.

EMBODIMENTS

Hereinafter, the mixture will be described in detail with reference to examples and comparative examples. However, the scope of the mixture is not limited by the following examples.

Hereinafter, the abbreviation "Vi" refers to a vinyl group, the abbreviation "Ph" refers to a phenyl group, the abbreviation "Me" refers to a methyl group, and the abbreviation "Ep" refers to a 3-glycidoxypropyl group.

Physical properties of cured products prepared in the examples and comparative examples were measured by the following methods.

1. Mole Fraction Evaluation Method

Silicon atoms connected by an ethylene group which is present in a cured product, a ratio (C/Si) of the number of moles of carbon atoms (C) which are present in the ethylene group to the total number of moles of silicon atoms (Si), or the like were measured according to a well-known $^{29}$Si NMR method. A reference compound used upon a measurement by $^{29}$Si NMR was dilute tetramethylsilane (TMS) dissolved in $CDCl_3$, and a chemical shift thereof was measured.

2. Long-Term Reliability at High Temperature

Properties of a device were evaluated using an LED package prepared by a poly phthal amide (PPA) or a polycyclohexyl phthal amide (PCT). Specifically, a surface-mount type LED was prepared by dispensing a mixture prepared in a PPA or PCT cup, and curing it under conditions represented in the examples or comparative examples. Subsequently, after the prepared LED operated for 1,000 hours with current of 50 mA while being maintained at 85° C., a brightness decreasing rate after operation with respect to initial brightness before the operation was measured, and thereby reliability was evaluated based on the following standard.

[Evaluation Standard]
O: brightness decreasing rate was 7% or less
X: brightness decreasing rate was more than 7%

3. Heat and Shock Durability

After 1 cycle was defined as maintaining the LED package at −40° C. for 15 minutes and then maintaining the LED package at 100° C. for 15 minutes again, and 200 cycles were repeated, the number of turned-off packages with respect to 20 of the total evaluated packages was evaluated, and thereby heat and shock durability was evaluated.

Example 1

120.0 g of an aliphatic unsaturated bond functional polyorganosiloxane having an average unit of the following Formula A, and having a weight-average molecular weight of about 2,100, and 36.6 g of a compound of the following Formula B were mixed, a catalyst of platinum (0)-1,3-divinyl-1,1,3,3-tetramethyldisiloxane in which a content of Pt (0) was 2 ppm was also mixed therein, and thereby a curable composition was prepared. Subsequently, the prepared curable composition was maintained at 140° C. for 1 hour, and thereby a cured product was prepared. Curing of the cured product was performed after dispensing the mixture in the PPA cup. As the analysis result of the prepared cured product, it was determined that the cured product included a $(PhSiO_{3/2})$ unit as a siloxane unit of Formula 2, and a ratio (T/Si) of the number of moles of the unit (T) to the total number of moles of silicon atoms (Si) was about 0.45. Further, the cured product was determined to include silicon atoms connected by an ethylene group, and a ratio (C/Si) of the number of moles of carbon atoms (C) which were present in the ethylene group to the total number of moles of silicon atoms (Si) was about 0.32. Further, a ratio (Ar/Si) of the total number of moles of aryl groups (Ar) which were present in the cured product to the total number of moles of silicon atoms (Si) was about 0.73, a ratio (D/Si) of the total number of moles of D units (D) in the cured product to the total number of moles of silicon atoms (Si) was about 0.25, and a ratio (V/Si) of the total number of moles of vinyl groups (V) to the total number of moles of silicon atoms (Si) was about 0.

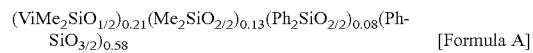   [Formula A]

   [Formula B]

Example 2

124.3 g of an aliphatic unsaturated bond functional polyorganosiloxane having an average unit of the following Formula C, and having a weight-average molecular weight of about 2,300, and 36.6 g of a compound of the following Formula B were mixed, a catalyst of platinum (0)-1,3-divinyl-1,1,3,3-tetramethyldisiloxane in which a content of Pt (0) was 2 ppm was also mixed therein, and thereby a curable composition was prepared. Subsequently, after dispensing the mixture in a PCT cup, the curable composition was maintained at 140° C. for 1 hour, and thereby a cured product was prepared in the same manner as in Example 1. As the analysis result of the prepared cured product, it was determined that the cured product included the $(PhSiO_{3/2})$ unit as the siloxane unit of Formula 2, and a ratio (T/Si) of the number of moles of the unit (T) to the total number of moles of silicon atoms (Si) was about 0.45. Further, the cured product included silicon atoms connected by an ethylene group, and a ratio (C/Si) of the number of moles of carbon atoms (C) which were present in the ethylene group to the total number of moles of silicon atoms (Si) was about 0.32. Further, a ratio (Ar/Si) of the total number of moles of aryl groups (Ar) which were present in the cured product to the total number of moles of silicon atoms (Si) was about 0.75, a ratio (D/Si) of the total number of moles of D units (D) to the total number of moles of silicon atoms (Si) was $(ViMe_2SiO_{1/2})_{0.21}(MeEPSiO_{2/2})_{0.03}(MePhSiO_{2/2})_{0.18}$
$(PhSiO_{3/2})_{0.58}$  [Formula C]

Example 3

116.7 g of an aliphatic unsaturated bond functional polyorganosiloxane having an average unit of the following Formula D, and having a weight-average molecular weight of about 2,300, and 36.6 g of a compound of the following Formula B were mixed, a catalyst of platinum (0)-1,3-divinyl-1,1,3,3-tetramethyldisiloxane in which a content of Pt (0) was 2 ppm was also mixed therein, and thereby a curable composition was prepared. Subsequently, the prepared mixture was dispensed in a PCT cup, was maintained at 140° C. for 1 hour, and thereby a cured product was prepared. In the above description, a PCT cup prebaked at 160° C. for about 30 minutes before dispensing the mixture was used as the PCT cup in which the mixture was dispensed. As the analysis result of the prepared cured product, it was determined that the cured product included the ($PhSiO_{3/2}$) unit as the siloxane unit of Formula 2, and a ratio (T/Si) of the number of moles of the unit (T) to the total number of moles of silicon atoms (Si) was about 0.35. Further, the cured product included silicon atoms connected by an ethylene group, and a ratio (C/Si) of the number of moles of carbon atoms (C) which were present in the ethylene group to the total number of moles of silicon atoms (Si) was about 0.32. Further, a ratio (Ar/Si) of the total number of moles of aryl groups (Ar) which were present in the cured product to the total number of moles of silicon atoms (Si) was about 0.69, a ratio (D/Si) of the total number of moles of D units (D) to the total number of moles of silicon atoms (Si) was about 0.37, and a ratio (V/Si) of the total number of moles of vinyl groups (V) to the total number of moles of silicon atoms (Si) was about 0.

$(ViMe_2SiO_{1/2})_{0.21}(Me_2SiO_{2/2})_{0.24}(Ph_2SiO_{2/2})_{0.12}(PhSiO_{3/2})_{0.43}$  [Formula D]

Comparative Example 1

120.3 g of an aliphatic unsaturated bond functional polyorganosiloxane having an average unit of the following Formula T, and having a weight-average molecular weight of about 2,050, and 36.6 g of a compound of the following Formula B were mixed, a catalyst of platinum (0)-1,3-divinyl-1,1,3,3-tetramethyldisiloxane in which a content of Pt (0) was 2 ppm was also mixed therein, and thereby a curable composition was prepared. Subsequently, after dispensing the mixture in a PCT cup, the curable composition was maintained at 140° C. for 1 hour, and thereby a cured product was prepared in the same manner as in Example 1. As the analysis result of the prepared cured product, it was determined that the cured product included the ($PhSiO_{3/2}$) unit as the siloxane unit of Formula 2, and a ratio (T/Si) of the number of moles of the unit (T) to the total number of moles of silicon atoms (Si) was about 0.28. Further, the cured product included silicon atoms connected by an ethylene group, and a ratio (C/Si) of the number of moles of carbon atoms (C) which were present in the ethylene group to the total number of moles of silicon atoms (Si) was about 0.32. Further, a ratio (Ar/Si) of the total number of moles of aryl groups (Ar) which were present in the cured product to the total number of moles of silicon atoms (Si) was about 0.72, a ratio (D/Si) of the total number of moles of D units (D) to the total number of moles of silicon atoms (Si) was about 0.41, and a ratio (V/Si) of the total number of moles of vinyl groups (V) to the total number of moles of silicon atoms (Si) was about 0.

$(ViMe_2SiO_{1/2})_{0.21}(Me_2SiO_{2/2})_{0.25}(Ph_2SiO_{2/2})_{0.18}(PhSiO_{3/2})_{0.36}$  [Formula T]

Comparative Example 2

122.2 g of an aliphatic unsaturated bond functional polyorganosiloxane having an average unit of the following Formula U, and having a weight-average molecular weight of about 2,550, and 17.5 g of a compound of the following Formula B were mixed, a catalyst of platinum (0)-1,3-divinyl-1,1,3,3-tetramethyldisiloxane in which a content of Pt (0) was 2 ppm was also mixed therein, and thereby a curable composition was prepared. Subsequently, after dispensing the mixture in a PCT cup, the curable composition was maintained at 140° C. for 1 hour, and thereby a cured product was prepared in the same manner as in Example 1. As the analysis result of the prepared cured product, it was determined that the cured product included the ($PhSiO_{3/2}$) unit as the siloxane unit of Formula 2, and a ratio (T/Si) of the number of moles of the unit (T) to the total number of moles of silicon atoms (Si) was about 0.62. Further, the cured product included silicon atoms connected by an ethylene group, and a ratio (C/Si) of the number of moles of carbon atoms (C) which were present in the ethylene group to the total number of moles of silicon atoms (Si) was about 0.19. Further, a ratio (Ar/Si) of the total number of moles of aryl groups (Ar) which were present in the cured product to the total number of moles of silicon atoms (Si) was about 0.84, a ratio (D/Si) of the total number of moles of D units (D) to the total number of moles of silicon atoms (Si) was about 0.25, and a ratio (V/Si) of the total number of moles of vinyl groups (V) to the total number of moles of silicon atoms (Si) was about 0.

$(ViMe_2SiO_{1/2})_{0.1}(Me_2SiO_{2/2})_{0.15}(Ph_2SiO_{2/2})_{0.07}(PhSiO_{3/2})_{0.68}$  [Formula U]

Comparative Example 3

The cured product was prepared in the same manner as in Example 3 except that a PCT cup which was not prebaked was used as the PCT cup in which the mixture was dispensed. As the analysis result of the prepared cured product, it was determined that the cured product included silicon atoms connected by an ethylene group, and a ratio (C/Si) of the number of moles of carbon atoms (C) which were present in the ethylene group to the total number of moles of silicon atoms (Si) was about 0.08. Further, a ratio (Ar/Si) of the total number of moles of aryl groups (Ar) which were present in the cured product to the total number of moles of silicon atoms (Si) was about 0.69, a ratio (D/Si) of the total number of moles of D units (D) to the total number of moles of silicon atoms (Si) was about 0.37, and a ratio (V/Si) of the total number of moles of vinyl groups (V) in the cured product to the total number of moles of silicon atoms (Si) was about 0.

Comparative Example 4

The cured product was prepared in the same manner as in Example 3 except that a mixture mixed with a catalyst (platinum (0)-1,3-divinyl-1,1,3,3-tetramethyldisiloxane) in which a content of Pt (0) was 0.2 ppm was used. As the analysis result of the prepared cured product, it was determined that the cured product included silicon atoms connected by an ethylene group, and a ratio (C/Si) of the number of moles of carbon atoms (C) which were present in the ethylene group to the total number of moles of silicon atoms (Si) was about 0.13. Further, a ratio (Ar/Si) of the total number of moles of aryl groups (Ar) which were present in the cured product to the total number of moles of silicon atoms (Si) was about 0.69, a ratio (D/Si) of the total number of moles of D units (D) to the total number of moles of silicon atoms (Si) was about 0.37, and a ratio (V/Si) of the total number of moles of vinyl groups (V) in the cured product to the total number of moles of silicon atoms (Si) was about 0.

The measurement results of physical properties of the cured products in the examples and comparative examples were summarized and represented in the following Table 1.

TABLE 1

|  | Reliability at high temperature | Heat and shock durability |
|---|---|---|
| Example 1 | ○ | 0/20 |
| Example 2 | ○ | 0/20 |
| Example 3 | ○ | 1/20 |
| Comparative Example 1 | X | 10/20 |
| Comparative Example 2 | X | 17/20 |
| Comparative Example 3 | X | 20/20 |
| Comparative Example 4 | X | 20/20 |

What is claimed is:

1. A cured product, which is a reaction product of a mixture comprising an aliphatic unsaturated bond functional polyorganosiloxane and a compound having hydrogen atoms bound to silicon atoms, and which comprises a unit of the following Formula 1 and a siloxane unit of the following Formula 2, wherein a ratio (C/Si) of the number of moles of carbon atoms (C) which are present in A of the following Formula 1 to the total number of moles of silicon atoms (Si) is in a range of 0.15 to 0.55, and a ratio (T/Si) of the number of moles of a siloxane unit of the following Formula 2 (T) to the total number of moles of silicon atoms (Si) is in a range of 0.3 to 0.6:

$(R_2SiO_{1/2}A_{1/2})$ [Formula 1]

$(RSiO_{3/2})$ [Formula 2]

where, in Formulas 1 and 2, each R is independently hydrogen, an epoxy group, or a monovalent hydrocarbon group, and A is an alkylene group having 2 to 4 carbon atoms, wherein the aliphatic unsaturated bond functional polyorganosiloxane shows an average unit of the following Formula 5:

$P_aO_bSiO_{(4-a-b)/2}$ [Formula 5]

where, in Formula 5, P is an alkenyl group, Q is an epoxy group, or a monovalent hydrocarbon group, a and b are numbers such that a+b is in a range of 1 to 1.9, and a/(a+b) is in a range of 0.06 to 0.15.

2. The cured product of claim 1, wherein the ratio (C/Si) of the number of moles of carbon atoms (C) which are present in A of Formula 1 to the total number of moles of silicon atoms (Si) is in a range of 0.15 to 0.5.

3. The cured product of claim 1, wherein the ratio (T/Si) of the number of moles of the siloxane unit of the following Formula 2 (T) to the total number of moles of silicon atoms (Si) is in a range of 0.35 to 0.5.

4. The cured product of claim 1, comprising an aryl group bound to the silicon atoms, wherein a ratio (Ar/Si) of the number of moles of the aryl group (Ar) to the total number of moles of silicon atoms (Si) is in a range of 0.2 to 1.2.

5. The cured product of claim 1, comprising an aryl group bound to the silicon atoms, wherein a ratio (Ar/Si) of the number of moles of the aryl group (Ar) to the total number of moles of silicon atoms (Si) is in a range of 0.4 to 1.0.

6. The cured product of claim 1, comprising a difunctional siloxane unit, wherein a ratio (D/Si) of the number of moles of the difunctional siloxane unit (D) to the total number of moles of silicon atoms (Si) is 0.6 or less.

7. The cured product of claim 1, wherein the compound having the hydrogen atoms bound to the silicon atoms shows an average unit of the following Formula 6:

$H_cQ_dSiO_{(4-c-d)/2}$ [Formula 6]

where, in Formula 6, Q is an epoxy group, an alkoxy group, or a monovalent hydrocarbon group, c and d are numbers such that c+d is in a range of 1 to 2.8, and c/(c+d) is in a range of 0.001 to 0.34.

8. The cured product of claim 1, wherein the compound having the hydrogen atoms bound to the silicon atoms is a compound of the following Formula 7:

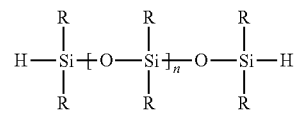
[Formula 7]

where, in Formula 7, each R is independently hydrogen, an epoxy group, or a monovalent hydrocarbon group, at least one R is an aryl group, and n is a number in a range of 1 to 2.

9. The cured product of claim 1, wherein a ratio (H/Ak) of the number of moles of the hydrogen atoms of the compound having the hydrogen atoms bound to the silicon atoms (H) to the number of moles of an aliphatic unsaturated bond of the aliphatic unsaturated bond functional polyorganosiloxane (Ak) is in a range of 0.5 to 3.0 in a mixture.

10. The cured product of claim 1, wherein a ratio (H/Ak) of the number of moles of the hydrogen atoms of the compound having the hydrogen atoms bound to the silicon atoms (H) to the number of moles of an aliphatic unsaturated bond of the aliphatic unsaturated bond functional polyorganosiloxane (Ak) is in a range of 1.05 to 1.3 in a mixture.

11. A semiconductor device encapsulated by an encapsulant comprising the cured product of claim 1.

12. An optical semiconductor device encapsulated by an encapsulant comprising the cured product of claim 1.

13. A liquid crystal display device comprising the optical semiconductor device of claim 12.

14. A lighting device comprising the optical semiconductor device of claim 12.

* * * * *